(12) United States Patent
Asami

(10) Patent No.: US 6,803,304 B2
(45) Date of Patent: Oct. 12, 2004

(54) METHODS FOR PRODUCING ELECTRODE AND SEMICONDUCTOR DEVICE

(75) Inventor: Yukio Asami, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/950,250

(22) Filed: Sep. 10, 2001

(65) Prior Publication Data

US 2002/0086518 A1 Jul. 4, 2002

(30) Foreign Application Priority Data

Sep. 11, 2000 (JP) ...................................... P2000-275695

(51) Int. Cl.$^7$ ...................... H01L 21/44; H01L 21/4763
(52) U.S. Cl. ........................ 438/613; 438/622; 438/624; 438/629
(58) Field of Search ................................. 438/622, 624, 438/627, 629, 633, 672, 612, 613, 614, 617

(56) References Cited

U.S. PATENT DOCUMENTS

| | | | | |
|---|---|---|---|---|
| 4,933,303 A | * | 6/1990 | Mo ............................ | 438/629 |
| 4,936,950 A | * | 6/1990 | Doan et al. .................. | 438/634 |
| 4,961,822 A | * | 10/1990 | Liao et al. ................... | 438/628 |
| 5,573,633 A | * | 11/1996 | Gambino et al. ........... | 438/633 |
| 5,587,337 A | * | 12/1996 | Idaka et al. ................. | 438/612 |
| 6,040,242 A | * | 3/2000 | Kakehashi ................... | 438/672 |
| 6,054,378 A | * | 4/2000 | Skala et al. .................. | 438/620 |
| 6,376,353 B1 | * | 4/2002 | Zhou et al. .................. | 438/612 |
| 6,420,255 B1 | * | 7/2002 | Takahashi ................... | 438/613 |

* cited by examiner

Primary Examiner—T. N. Quach
(74) Attorney, Agent, or Firm—Robert J. Depke; Holland & Knight LLP

(57) ABSTRACT

A method for producing an electrode enabling fabrication of small electrodes at a high dimensional accuracy without being affected by the number of connections between chips, comprising the steps of forming an insulating film on an interconnection pattern of a semiconductor chip, forming a mask layer having an opening on the insulating film at a position where an electrode is to be formed, removing the insulating film within the opening by using the mask layer as a mask to expose a portion of the interconnection pattern, forming a conductor layer on the exposed interconnection pattern and the mask layer, removing the conductor layer formed on the mask layer while leaving the conductor layer formed on the exposed interconnection pattern, and removing the mask layer, and a method for producing a semiconductor device provided with such electrode.

10 Claims, 9 Drawing Sheets

METHODS FOR PRODUCING ELECTRODE AND SEMICONDUCTOR DEVICE

RELATED APPLICATION DATA

The present application claims priority to Japanese Application(s) No(s). P2000-275695 filed Sep. 11, 2000, which application(s) is/are incorporated herein by reference to the extent permitted by law.

BACKGROUND OF THE INVENTION

1. Field of the Invention

The present invention relates to methods for producing an electrode and a semiconductor device, more particularly relates to methods for producing an electrode formed in a small size and high density semiconductor device for mounting the same device and for producing a semiconductor device provided with the electrode.

2. Description of the Related Art

In the past, progress has been made in semiconductor processes to incorporate many kinds of functions into one chip to improve the performance. Because of the necessity of combining different processes, there was a tendency for the processing steps to become complicated, the number of steps to increase, the yield to decline, and the turn-around time (TAT) to increase.

Thereupon, in recent years, the practice has become to fabricate IC chips having different functions and to use packages of them to give the same performance as a single chip, i.e., to use a multi-chip module (MCM).

Specifically, there is the method of mounting chips on an organic or ceramic board called an interposer, on which interconnections are laid in advance, then connecting the pads of IC chips and pads of the interposer by wire bonding so as to form an interface among the IC chips. Alternatively, there is the method of forming bumps (projecting electrodes) on IC chips in advance by gold or solder, then matching and connecting the bumps with the pads of the interposer.

In the above methods of the related art, however, in order to secure good connections by the wire bonding or bumps, a connection area of not less than 50×50 $\mu m^2$ was needed for pads on the IC chip, and a pitch not less than 70 to 80 $\mu m$ was necessary to avoid contact with neighboring wires or bumps.

Therefore, due to the above rule, even if arranging pads all over the available area of an IC chip, the number of pads was limited to several hundred at most. Especially, with the wire bonding method, there was an unfavorable constraint that pads could be arranged only at the periphery of a chip.

As a result, it suffers from the disadvantage that the MCM method was not usable when over 1000 connections were required. In this case, the functions all had to be provided on a single chip.

In this way, in the methods of the related art, there was the disadvantage that the number of connections between chips was highly limited.

SUMMARY OF THE INVENTION

An object of the present invention is to provide a method for producing an electrode which enables over 1000 interconnections between chips, impossible in the related art, and enables fabrication of small electrodes with a high dimensional accuracy without being affected by the number of connections between chips.

Another object of the present invention is to provide a method for producing a semiconductor device provided with the electrode.

To attain the first object, according to a first aspect of the present invention, there is provided a method for producing an electrode for forming at least one electrode on a semiconductor chip on which semiconductor integrated circuit elements and an interconnection pattern are formed, comprising the steps of forming an insulating film on the interconnection pattern of the semiconductor chip, forming on the insulating film a mask layer having an opening at a position where the electrode is to be formed, removing the insulating film within the opening by using the mask layer as a mask to expose a portion of the interconnection pattern, forming a conductor layer on the exposed interconnection pattern and the mask layer, removing the conductor layer formed on the mask layer while leaving the conductor layer formed on the exposed interconnection pattern, and removing the mask layer.

For example, the step of forming the conductor layer comprises a step of forming the conductor layer by copper.

In this case, the method further comprises a step of forming a barrier film on the exposed interconnection pattern and the mask layer after exposing a portion of the interconnection pattern and before forming the conductor layer. The step of forming the conductor layer then comprises a step of forming the conductor layer on the barrier film, while the step of removing the conductor layer comprises a step of removing the barrier film and the conductor layer formed on the mask layer while leaving the barrier film and the conductor layer formed on the exposed interconnection pattern.

Preferably, the method further comprises a step of forming a protective film on the conductor layer after removing the mask layer.

To attain the above object, according to a second aspect of the present invention, there is provided a method for producing a semiconductor device comprising the steps of forming a semiconductor integrated circuit element on a substrate, forming an interlayer insulating film to cover the semiconductor integrated circuit element, forming a connection hole for connecting with the semiconductor integrated circuit element and an interconnection groove on the interlayer insulating film, burying the connection hole and the interconnection groove with a conductor layer to form an interconnection pattern, forming an insulating film on the interconnection pattern, forming a mask layer having an opening in the insulating film at a position where the electrode is to be formed, removing the insulating film within the opening by using the mask layer as a mask to expose a portion of the interconnection pattern, forming a conductor layer on the interconnection pattern and the mask layer, removing the conductor layer formed on the mask layer while leaving the conductor layer formed on the interconnection pattern, and removing the mask layer.

Further, in case of multi-layer interconnections, the method comprises, after forming the interconnection pattern and before forming the insulating film, a step of repeating a step of further forming an upper interlayer insulating film to cover the interconnection pattern; the step of forming a connection hole for connecting with the lower interconnection pattern and an interconnection groove in the interlayer insulating film; and the step of burying the connection hole and the interconnection groove by a conductor layer to form an upper interconnection pattern. Further, the step of forming an insulating film on the interconnection pattern comprises forming an insulating film on the uppermost interconnection pattern, while the step of exposing a portion of the interconnection pattern comprises exposing a portion of the uppermost interconnection pattern.

According to the methods for producing an electrode and a semiconductor device according to the present invention, in the formation of a circuits by repeating the steps of forming interlayer insulating films and interconnection patterns on a substrate formed with semiconductor integrated circuit elements, after an interconnection pattern is formed, an insulating film and a mask layer are formed, an opening having a reasonable diameter is formed at a position where the electrode is to be formed, the opening is buried with a conductor layer (the material of the interconnection), the mask layer is removed, and finally a projecting small electrode (micro-bump) is formed on the insulating film.

By this, a small electrode can be formed at a high dimensional accuracy in fabrication of a semiconductor device formed with semiconductor integrated circuit elements.

Further, when copper is used for the conductor layer, in order to prevent oxidation of the exposed portion, a protective film comprised of nickel or aluminum is formed.

BRIEF DESCRIPTION OF THE DRAWINGS

The above objects and features of the present invention will be more apparent from the following description of the preferred embodiments given with reference to the accompanying drawings, wherein:

FIG. 2A is a view of formation of an insulating film, FIG. 2B is a view of formation of an interconnection groove for a first interconnection layer, and FIG. 2C is a view of formation of a layer for barrier film and a layer for the first interconnection layer;

FIG. 3A is a view of formation of the barrier film and the first interconnection layer, and FIG. 3B is a view of formation of a silicon nitride film and an interlayer insulating film;

FIG. 4A is a view of formation of a silicon nitride film and an interlayer insulating film and FIG. 4B is a view of formation of a groove for a second interconnection layer and a connection hole;

FIG. 5A is a view of formation of a layer for a barrier film, and FIG. 5B is a view of formation of a barrier film for the second interconnection layer and a barrier film for a metal plug;

FIG. 6A is a view of formation of a metal layer for a metal plug and the second interconnection layer, and FIG. 6B is a view of formation of the second interconnection layer and the metal plug;

FIG. 7A is a view of formation of an insulating film and a resist film for forming an electrode, and FIG. 7B is a view of formation of an opening for the electrode;

FIG. 9A is a view of formation of a barrier film and a main electrode, and FIG. 9B is a view of formation of an electrode.

DESCRIPTION OF THE PREFERRED EMBODIMENTS

Below, an explanation will be made of preferred embodiments of a method for producing an electrode and a method for producing a semiconductor device according to the present invention with reference to the accompanying drawings.

Figure 1:
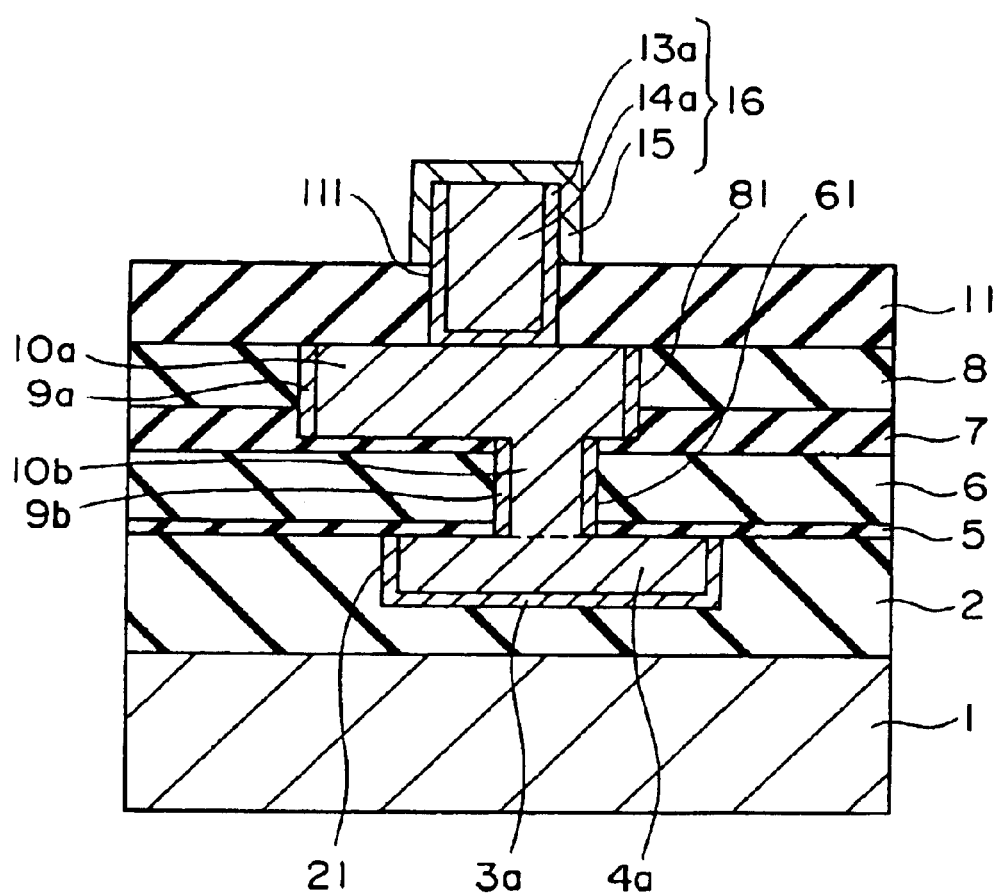
FIG. 1 is a sectional view of a semiconductor device having an electrode according to the present invention.

FIG. 1 is a sectional view of a semiconductor device according to the present invention.

In the semiconductor device shown in FIG. 1, for example, a silicon substrate 1 on which metal oxide semiconductor (MOS) transistors or other semiconductor integrated circuit elements are formed has formed on it, for example, an interlayer insulating film 2 comprised of silicon oxide etc. An interconnection groove 21 for forming a first interconnection layer is formed in the interlayer insulating film 2. Inside the interconnection groove 21, a barrier film 3a comprised of for example TiN for preventing diffusion of copper and the first interconnection layer comprised of for example copper are formed by burial.

Covering the interlayer insulating film 2 and the first interconnection layer 4a are formed a silicon nitride film 5 for preventing diffusion of copper, an interlayer insulating film 6 comprised of for example silicon oxide, a silicon nitride film 7, and an interlayer insulating film 8 comprised of for example silicon oxide. An interconnection groove 81 for forming the second interconnection layer is formed in the interlayer insulating film 8 and the silicon nitride film 7. A connection hole 61 is formed for electrically connecting the first interconnection layer 4a and the second interconnection layer in the interlayer insulating film 6 and the silicon nitride film 5. In addition, a barrier film 9a is formed on the side walls of the interconnection groove 81, while a barrier film 9b is formed on the side walls of the connection hole 61.

The interconnection groove 81 and the connection hole 61 are buried by copper or another conductive material, whereby the second interconnection layer 10a and a metal plug 10b are formed.

Further, covering the interlayer insulating film 8 and the second interconnection layer 10a, an insulating film 11 comprised of for example silicon nitride is formed. A barrier film 13a comprised of for example TiN for preventing diffusion of copper and a main electrode 14a comprised of for example copper are formed in an opening 111 formed in the insulating film 11. Covering the main electrode 14a, a protective film 15 comprised of for example Ni/Al is formed for preventing oxidation of the metal material comprising the main electrode 14a.

The above main electrode 14a, the barrier film 13a, and the protective film 15 form an electrode 16 having a portion projecting from the insulating film 11.

Below, an explanation will be made of the method for producing a semiconductor device provided with an electrode having the above configuration.

Figure 2A:
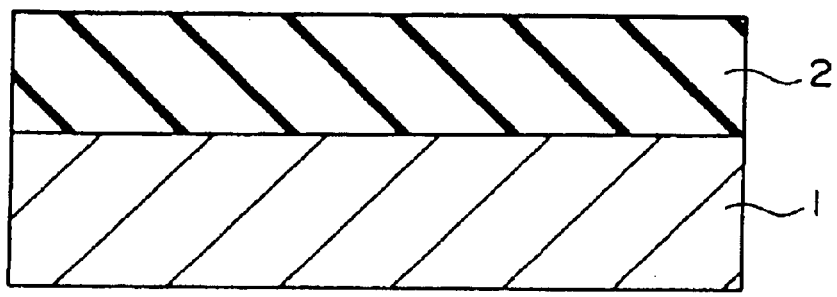
FIGS. 2A to 2C are sectional views of steps of a method for producing a semiconductor device having an electrode according to the present invention, where

First, as shown in FIG. 2A, for example, a not shown MOS transistor or other integrated circuit element is deposited on a silicon substrate 1, then for example silicon oxide is deposited by for example chemical vapor deposition (CVD) to form an interlayer insulating film 2 to a thickness of for example 1 μm.

Figure 2B:
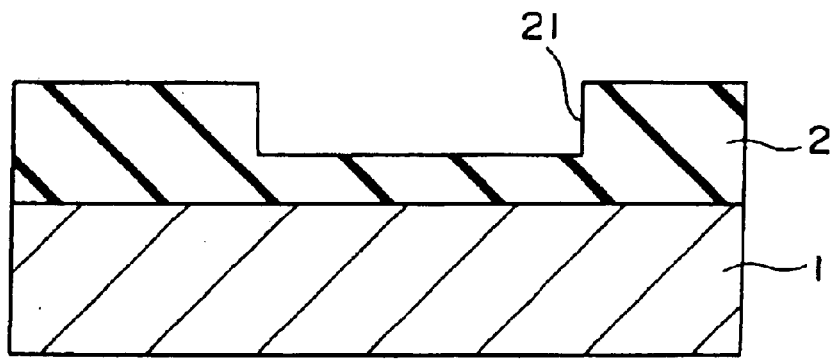

Next, as shown in FIG. 2B, a not shown resist film which has an opening in the region for forming an interconnection groove for the first interconnection layer is formed on the interlayer insulating film 2 by for example photolithography. Using this resist film as a mask, an interconnection groove 21 is formed in the interlayer insulating film 2 to, for example, 500 nm in depth by for example reactive ion etching (RIE) or other anisotropic etching. After that, the resist film is removed.

Note that in the present embodiment, while an explanation is omitted, after this, a contact hole is formed for connecting with the MOS transistor or other integrated circuit element formed on the silicon substrate 1.

Figure 2C:
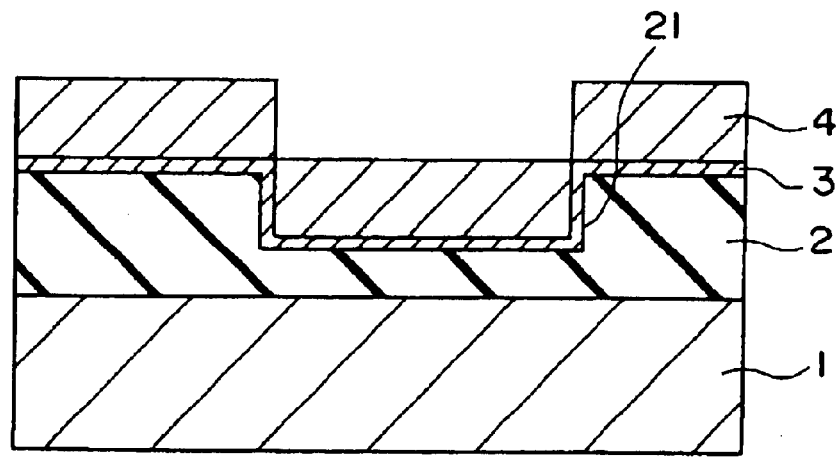

Next, as shown in FIG. 2C, TiN for preventing diffusion of copper into the interlayer insulating film 2 and for improving bonding and, for example, copper serving as the material of the interconnections are deposited completely covering the interlayer insulating film 2 including the interconnection groove 21 by for example CVD to thereby formed on the interlayer insulating film 2 for example a 50 nm thick layer 3 for a barrier film and a 500 thick layer 4 for the first interconnection.

Figure 3A:
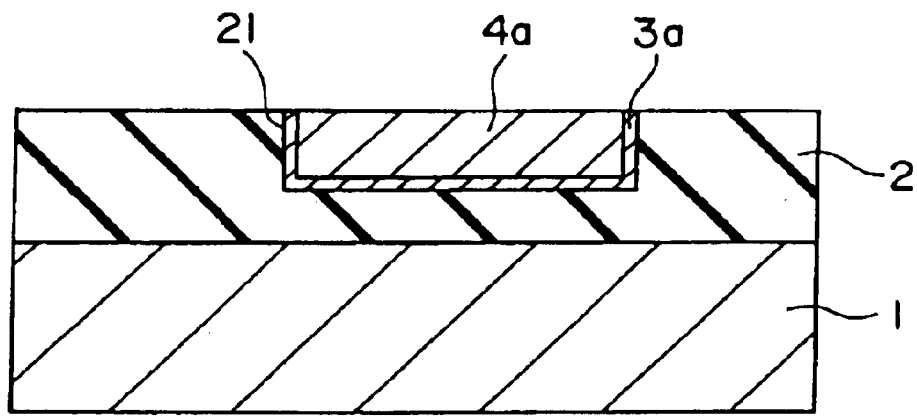
FIGS. 3A and 3B are sectional views of steps continuing from FIGS. 2A to 2C, where

Next, as shown in FIG. 3A, the layer 3 for the barrier film and the layer 4 for the first interconnection formed in regions other than the interconnection groove 21 are removed by for example, chemical mechanical polishing (CMP) to thereby form the barrier film 3a and the first interconnection layer 4a.

Figure 3B:
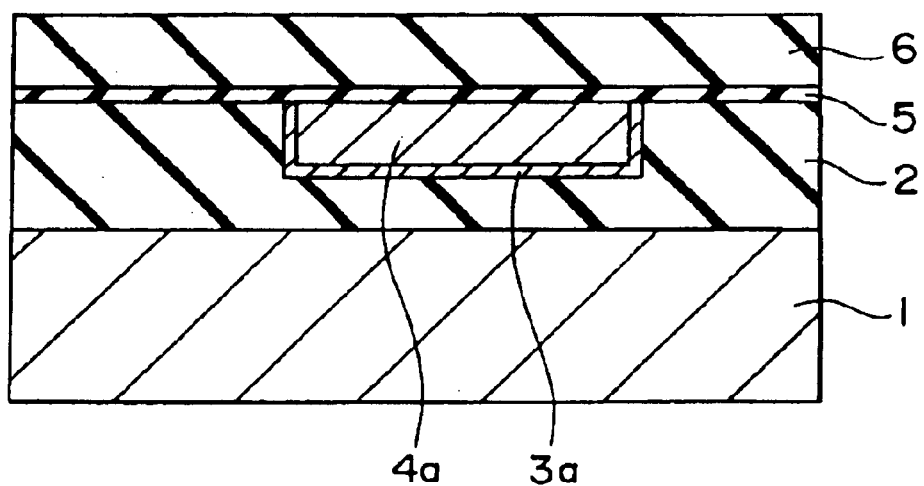

Next, as shown in FIG. 3B, silicon nitride and silicon oxide are deposited on the entire surface covering the exposed portions of the first interconnection layer 4a and the barrier film 3a and the interlayer insulating film 2 by for example CVD to thereby form for example a 100 nm thick silicon nitride film 5 for preventing diffusion of copper in the first interconnection and a 500 nm thick interlayer insulating film 6.

Figure 4A:
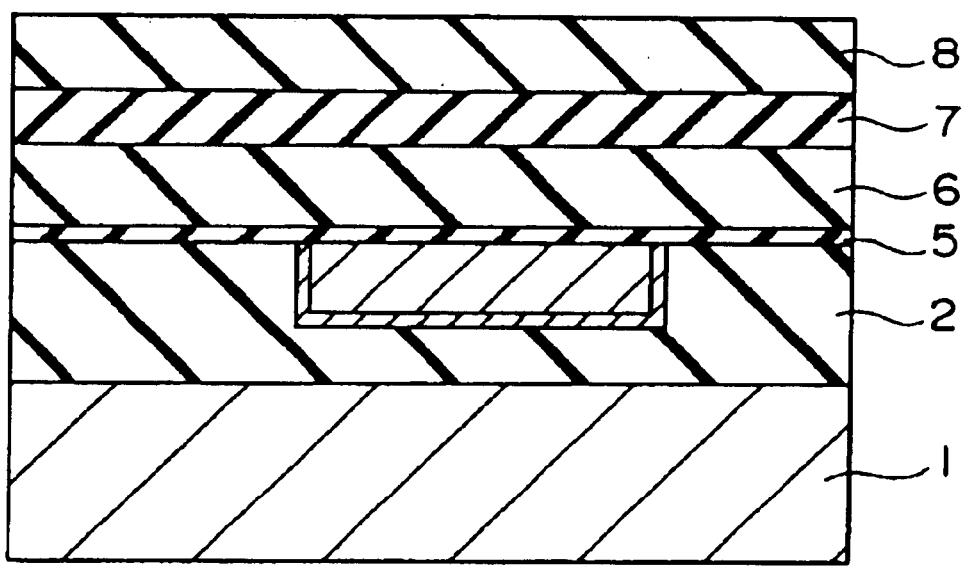
FIGS. 4A and 4B are sectional views of steps continuing from FIGS. 3A and 3B, where

Next, as shown in FIG. 4A, silicon nitride and silicon oxide are further deposited on the entire surface by for example CVD covering the interlayer insulating film 6 to thereby form for example a 300 nm thick silicon nitride film 7 for preventing diffusion of copper in the second interconnection and a 500 nm thick interlayer insulating film 8.

Figure 4B:
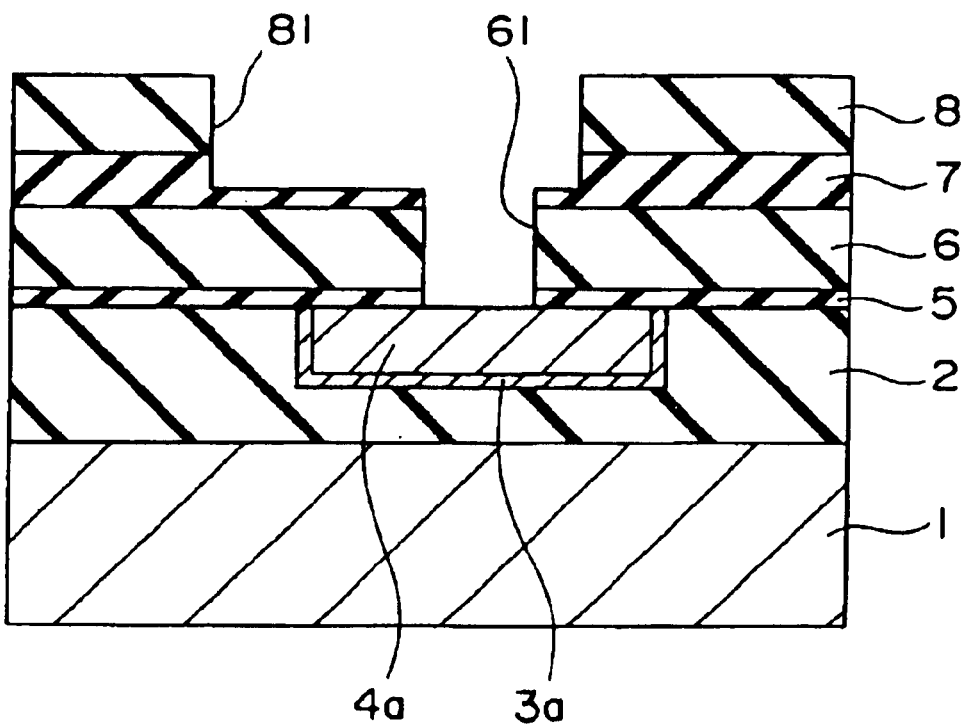

Next, as shown in FIG. 4B, a not shown resist film which has an opening in the region for forming an interconnection groove for the second interconnection layer is formed on the interlayer insulating film 8 by, for example, photolithography. Using this resist film as a mask, an interconnection groove 81 of, for example, 500 nm in depth is formed in the interlayer insulating film 8 and the silicon nitride film 7 by for example by RIE or other anisotropic etching. After that, the resist film is removed.

In addition, a not shown resist film which has an opening in the region for forming a connection hole for connecting the first and second interconnections is formed on the silicon nitride film 7 and interlayer insulating film 8 by, for example, photolithography. Using this resist film as a mask, a connection hole 61 for example 700 nm in depth exposing the surface of the first interconnection 4a is formed in the silicon nitride film 7, the interlayer insulating film 6, and the silicon nitride film 5 by for example RIE or other anisotropic etching. After that, the resist film is removed.

Figure 5A:
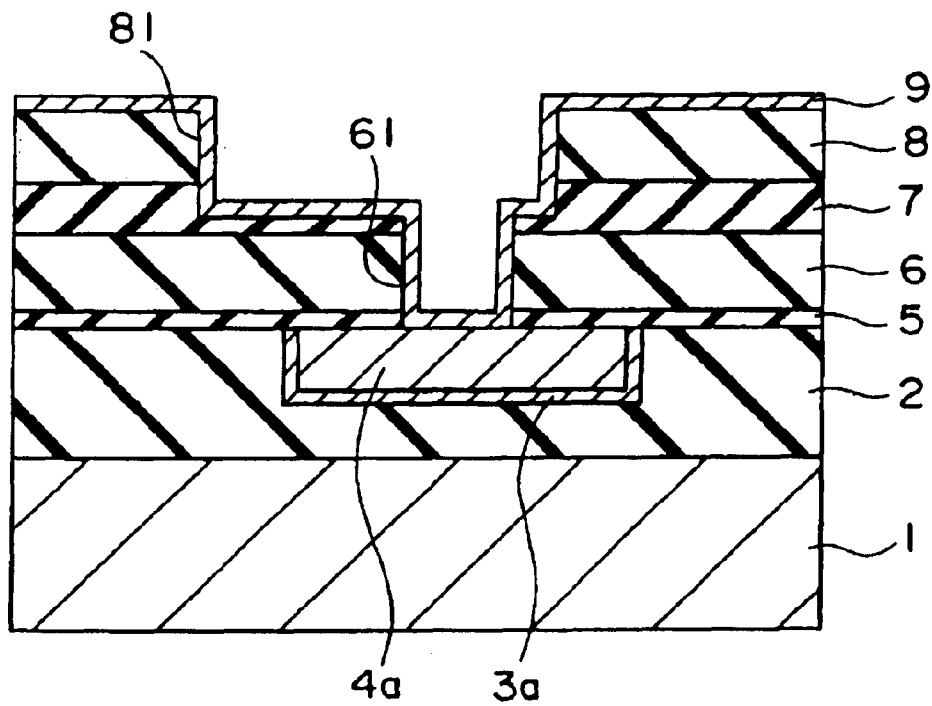
FIGS. 5A and 5B are sectional views of steps continuing from FIGS. 4A and 4B, where

Next, as shown in FIG. 5A, for example, TiN for preventing diffusion of copper into the interlayer insulating film and for bonding adhesion is deposited covering the first interconnection 4a exposed in the connection hole 61, the inside of the connection hole 61, the inside of the interconnection groove 81, and the interlayer insulating film 8 by for example CVD to form a layer 9 for a barrier film of a thickness of for example 50 nm.

Figure 5B:
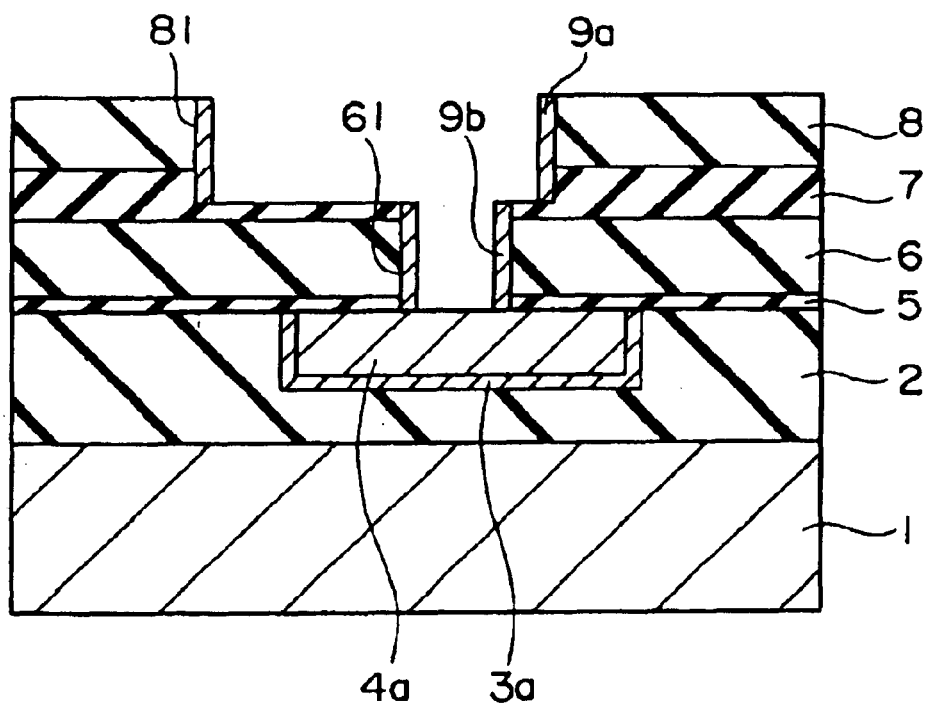

Next, as shown in FIG. 5B, this is etched back by for example RIE or other anisotropic etching to leave the layer 9 for the barrier film only on the side walls of the interconnection groove 81 for forming the second interconnection and the connection hole 61 and thereby form the barrier film 9a for preventing diffusion of copper into the second interconnection layer and the barrier film 9b for preventing diffusion of copper from the metal plug.

Here, since copper oxide is formed on the exposed surface of the first interconnection 4a after etch back, $O^2$ plasma, dilute hydrogen fluoride (HF), and H-gas (hfac: hexafluoroacetyl acetonate) are used to remove the copper oxide formed on the surface of the first interconnection 4a and remove the eching residues.

Figure 6A:
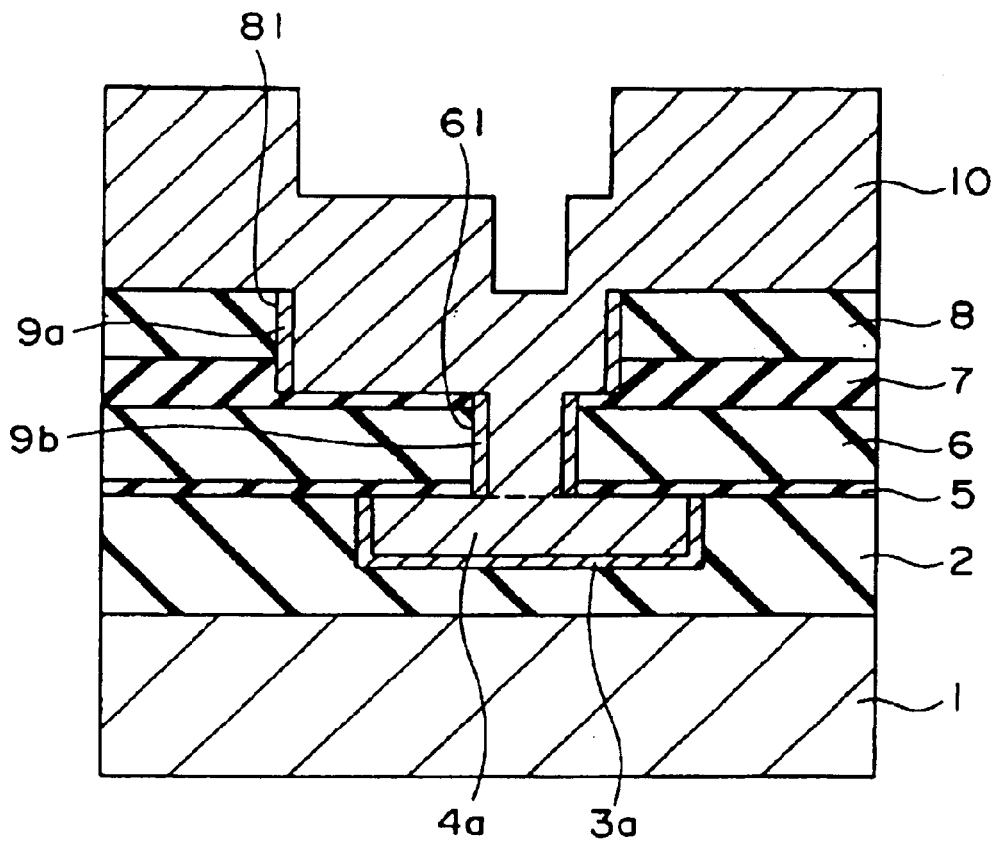
FIGS. 6A and 6B are sectional views of steps continuing from FIGS. 5A and 5B, where

Next, as shown in FIG. 6A, copper is deposited as the material of the second interconnection covering the first interconnection 4a exposed in the connection hole 61, the inside of the connection hole 61, the inside of the interconnection groove 81, and the interlayer insulating film 8 by, for example, CVD, to form a metal layer 10 of a thickness of for example 1.4 $\mu$m.

Figure 6B:
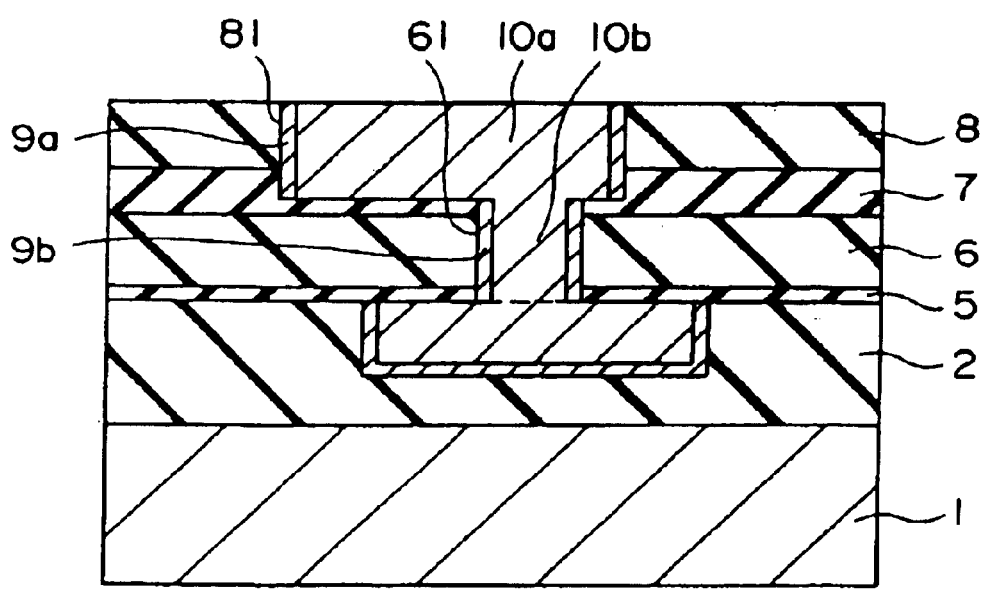

Next, as shown in FIG. 6B, the metal layer 10 formed in regions other than the interconnection groove 81 and the connection hole 61 is removed by for example CMP to thereby simultaneously form the second interconnection 10a and the metal plug 10b (dual damascence process).

Figure 7A:
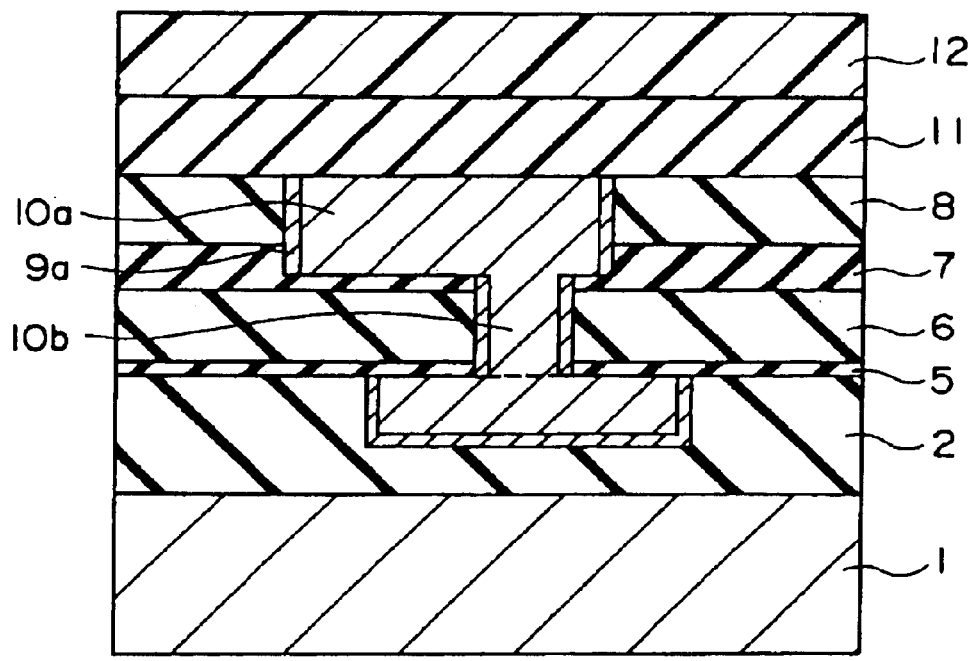
FIGS. 7A and 7B are sectional views of steps continuing from FIGS. 6A and 6B, where

Next, as shown in FIG. 7A, silicon nitride is deposited over the entire surface covering the exposed portions of the second interconnection 10a and the barrier film 9a and the interlayer insulating film 8 by for example CVD to form the insulating film 11 is formed. Further, a resist is coated to form a resist film 12.

Figure 7B:
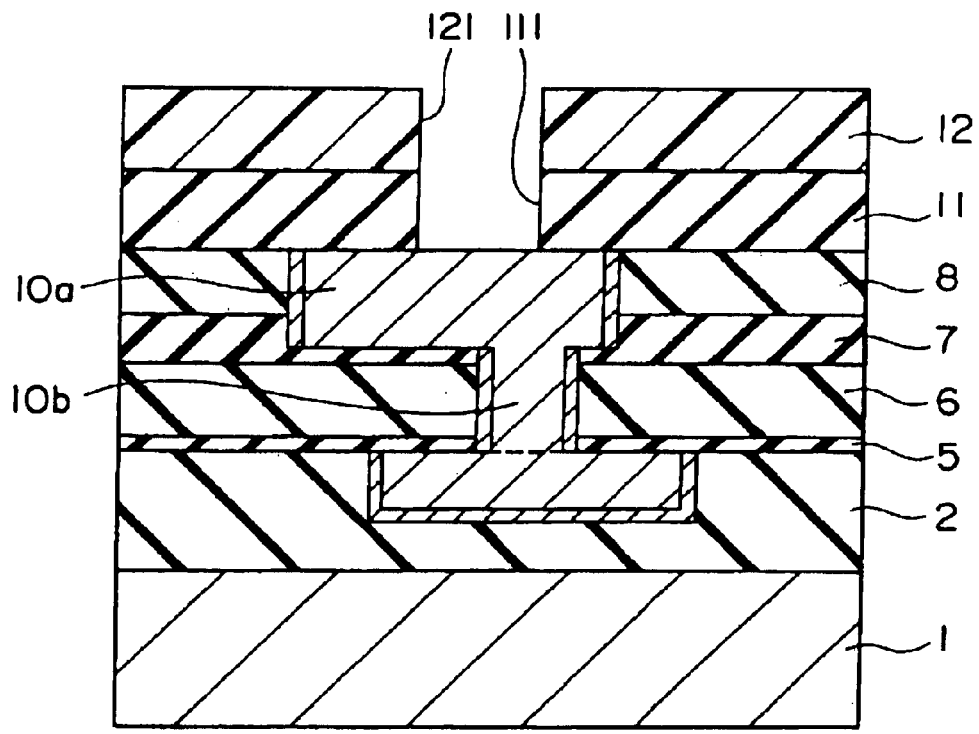

Next, as shown in FIG. 7B, an opening 121 for forming an electrode (bump) is formed in the resist film 12 by for example photolithography. Using the resist film 12 as a mask, an opening 111 is formed in the interlayer insulting film 11 by for example RIE or other anisotropic etching.

Figure 8:
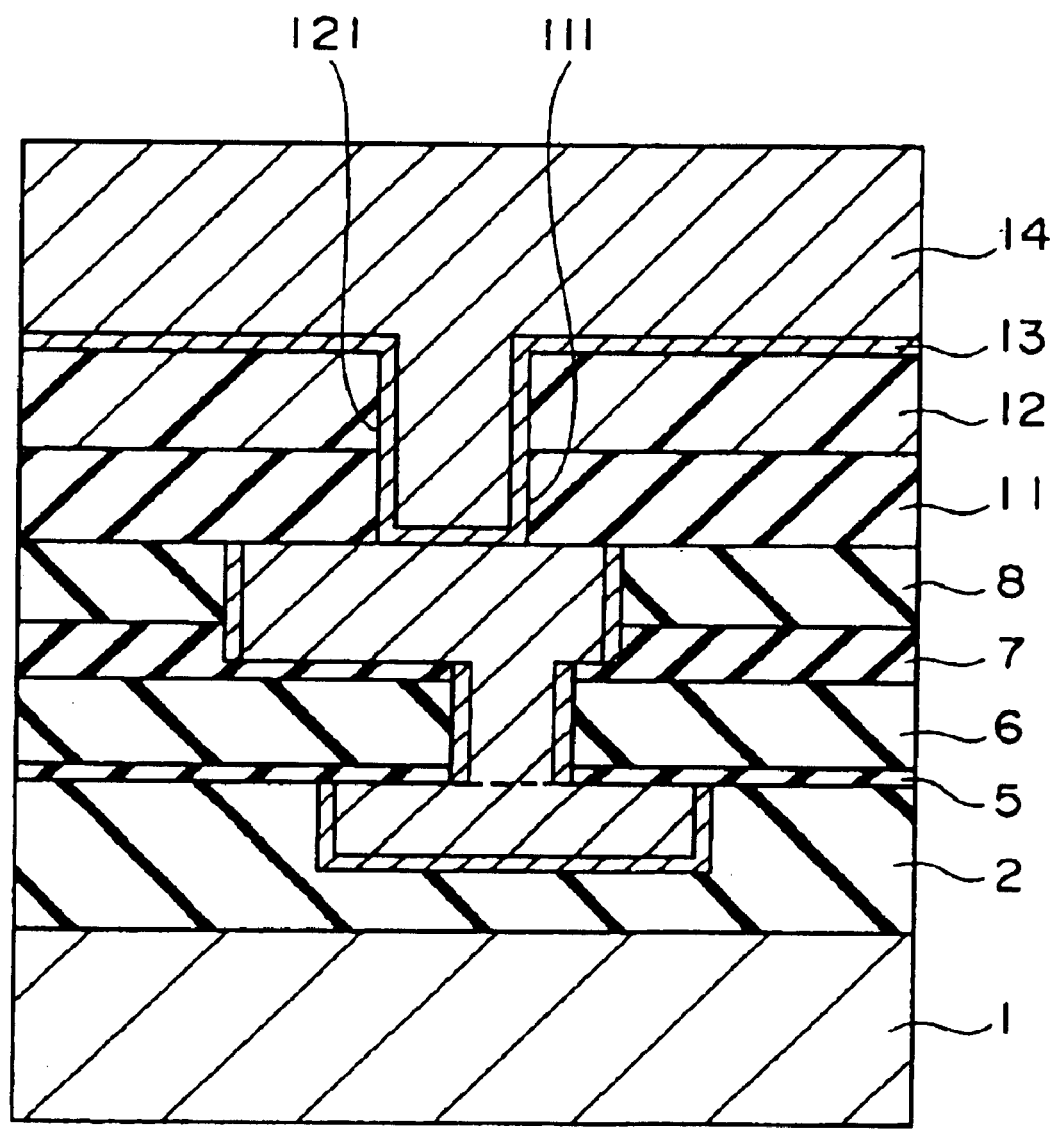
FIG. 8 is sectional view of a step continuing from FIGS. 7A and 7B and showing formation of a layer for a barrier film and a layer for the main electrode.

Next, as shown in FIG. 8, TiN for preventing diffusion of copper into the interlayer insulating film and for improving bonding and for example copper serving as the main material of the electrode are deposited by for example CVD over the entire surface covering the inside of the opening 111 of the interlayer insulating film 11, the inside of the opening 121 of the resist film 12, and the resist film 12 to thereby form a layer 13 for a barrier film and a layer 14 for the main electrode.

Figure 9A:
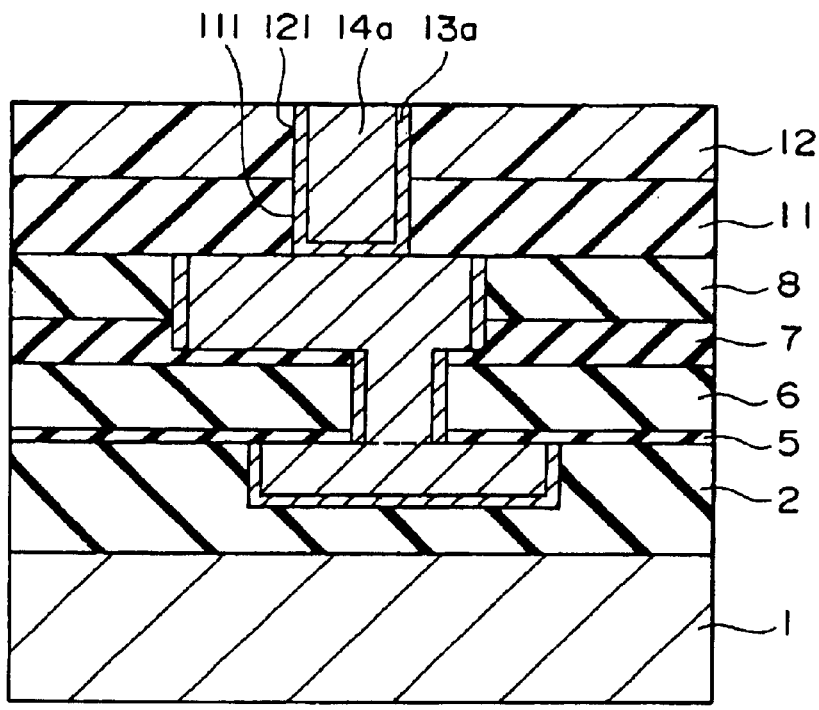
FIGS. 9A and 9B are sectional views of steps continuing from FIG. 8, where

Next, as shown in FIG. 9A, the layer 13 for the barrier film and the layer 14 for the main electrode formed in regions other than the openings 121 and 111 are removed by for example CMP to thereby form the barrier film 13a and the main electrode 14a.

Figure 9B:
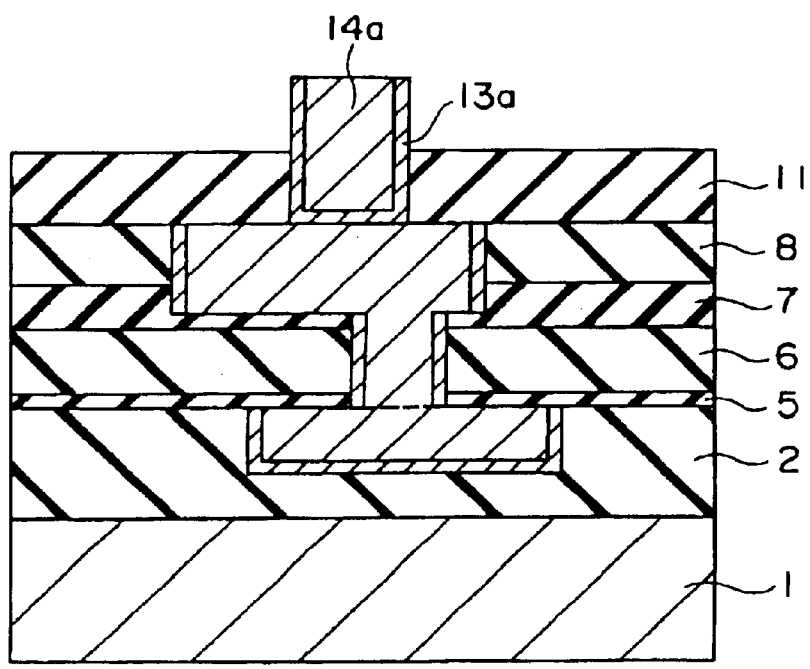

Next, as shown in FIG. 9B, the resist film 12 is removed to form an electrode which has a portion projecting from the insulating film 11 and is comprised of the barrier film 13a and the main electrode 14a.

As the subsequent steps, a protective film 15 comprised of for example Ni/Al for preventing oxidation of the copper or other metals is formed on the surface of the electrode (13a, 14a) to thereby form a semiconductor device as shown in FIG. 1 comprising the main electrode 14a, the barrier film 13a, and the protective film 15.

According to the above method for producing a semiconductor device provided with an electrode according to the present embodiment, for example, a copper electrode can be easily formed by employing the damascence method used in interlayer interconnection process in an IC chip.

Therefore, because this method is one used for processing wafers, the interconnection rule and the design rule in the wafer process are applicable, so over 1000 microbumps can be easily formed on the surface of the chip and small electrodes can be easily formed at a high dimensional accuracy.

The methods for producing a semiconductor device and an electrode according to the present invention are not limited to the description of the above embodiment. For example, in the present embodiment, the explanation was made of use of copper as the material of the interconnections, but for example aluminum etc. can also be used.

Here, when using aluminum as the material of the interconnections, the barrier film or the silicon nitride film used for preventing diffusion of copper in the present embodiment are not required.

In addition, in the present embodiment, the explanation was made of the case of two layers of interconnections, but the present invention is also applicable to more layers of interconnections.

Further, in the present embodiment, the explanation was made of the method for producing a semiconductor device having MOS transistors, but the present invention is applicable to any other semiconductor device such as bipolar semiconductor devices, BiCMOS semiconductor devices, and compound semiconductor devices as well.

In addition to the above, numerous modifications can be made to the present invention without departing from the basic concept and scope of the invention.

Summarizing the effects of the present invention, according to the methods for producing a semiconductor device and an electrode according to the present embodiment, small electrodes can be fabricated at a high dimensional accuracy.

What is claimed is:

1. A method for producing electrode contacts for a semiconductor chip having a plurality of previously formed individual semiconductor integrated circuit elements secured to a substrate comprising the steps of:
    forming an insulating film on an interconnection pattern of a first integrated circuit element that has been secured to the substrate,
    forming on the insulating film a mask layer having an opening at a position where electrodes of the first semiconductor integrated circuit element are located,
    removing the insulating film within the opening by using the mask layer as a mask to expose a portion of the interconnection pattern,
    forming a conductor layer on the exposed interconnection pattern and the mask layer,
    removing the conductor layer formed on the mask layer while leaving the conductor layer formed on the exposed interconnection pattern, and
    removing the mask and further wherein the conductor formed on the exposed interconnection pattern forms an electrical connection to a second intergrated circuit element that is also secured to the substrate, electrical connection to the second integrated circuit element also being formed by patterning insulation formed on the second integrated circuit element while it is secured to the substrate.

2. A method for producing an electrode as set forth in claim 1, further comprising a step of forming a barrier film on the exposed interconnection pattern and the mask layer after exposing a portion of the interconnection pattern and before forming the conductor layer, wherein
    the step of forming the conductor layer comprises a step of forming the conductor layer on the barrier film and
    the step of removing the conductor layer comprises a step of removing the barrier film and the conductor layer formed on the mask layer while leaving the barrier film and the conductor layer formed on the exposed interconnection pattern.

3. A method for producing electrode contacts as set forth in claim 2, wherein the step of forming the conductor layer comprises a step of forming the conductor layer with copper.

4. A method for producing an electrode as set forth in claim 1, further comprising a step of forming a protective film on the conductor layer after removing the mask layer.

5. A method of producing electrode contacts for a semiconductor device having a plurality of individual previously formed semiconductor integrated circuit elements secured to a common substrate comprising the steps of:
    forming an interlayer insulating film to cover an interconnection pattern of a first semiconductor integrated circuit element that is secured to the substrate,
    forming a connection hole in the interlayer insulating film over each of a plurality of electrical connection points, filling the connection holes with a conductor layer;
    forming an insulating film over the filled holes;
    forming a mask layer for the purpose of forming openings in the insulating film at positions where electrode contacts are to be formed;
    selectively removing the insulating film by using the mask layer as a mask to form openings;
    filling the openings with a conductor by applying a conductive layer over the openings and the mask to form the electrical contacts,
    and further wherein the conductor filling an opening forms an electrical connection to a second integrated circuit element that is also secured to the substrate, electrical connection to the second integrated circuit element also being formed by patterning insulation formed on the second integrated circuit element while it is secured to the substrate.

6. A method for producing external electrode contacts for a semiconductor device as set forth in claim 5, wherein
    the step of forming an insulating film comprises a step of forming an insulating film on an uppermost interconnection pattern and
    the step of exposing a portion of the interconnection pattern comprises a step of exposing a portion of the upper most interconnection pattern.

7. A method for producing electrode contacts for a semiconductor device as set forth in claim 5, further comprising a step of forming a barrier film on the exposed interconnection pattern and before filling with the conductor layer, and wherein
    the step of removing the conductor layer comprises a step of removing the barrier film and the conductor layer formed on the mask layer while leaving the barrier film and the conductor layer formed on the exposed interconnection pattern.

8. A method for producing electrode contacts for a semiconductor device as set forth in claim 7, wherein the step of forming the conductor layer comprises a step of forming the conductor layer with copper.

9. A method for producing electrode contacts for a semiconductor device as set forth in claim 5, comprising a step of forming a protective film on the conductor layer after removing the mask layer.

10. A method for producing electrode contacts for a semiconductor chip having a plurality of individual previously formed semiconductor integrated circuit elements secured to a substrate comprising the steps of:

forming an insulating film on an interconnection pattern of a first intergrated circuit element secured to the substrate, forming on the insulating film a mask layer having an opening at a position where each electrode contact is to be formed, removing the insulating film within the opening by using the mask layer as a mask to expose a portion of the interconnection pattern, forming a conductor layer on the exposed interconnection pattern and the mask layer, removing the conductor layer formed on the mask layer while leaving the conductor layer formed on the exposed interconnection pattern, and removing the mask; and forming a further electrode in contact with a portion of the conductor layer and a further insulting layer above the insulating film and further wherein the conductor formed on the exposed interconnection pattern forms an electrical connection to a second integrated circuit element that is also secured to the substrate, electrical connection to the second integrated circuit element also being formed by patterning insulation formed on the second integrated circuit element while it is secured to the substrate.

* * * * *